United States Patent [19]

Berner

[11] Patent Number: 4,967,313
[45] Date of Patent: Oct. 30, 1990

[54] ELECTRONIC CIRCUIT AND METHOD OF PRODUCTION THEREOF

[75] Inventor: Gianni Berner, Baden, Switzerland

[73] Assignee: Contraves AG, Zurich, Switzerland

[21] Appl. No.: 380,458

[22] Filed: Jul. 7, 1989

[30] Foreign Application Priority Data

Jul. 15, 1988 [DE] Fed. Rep. of Germany ....... 3824008

[51] Int. Cl.⁵ .............................................. H05K 7/02
[52] U.S. Cl. ...................................... 361/400; 29/843; 29/860; 361/406
[58] Field of Search ................................ 361/386–389, 361/400, 406–408, 411; 29/831, 840, 843, 854, 857, 860

[56] References Cited

U.S. PATENT DOCUMENTS 4,339,785  7/1982  Oshawa ............................... 361/400
4,349,860  9/1982  Oshawa ............................... 361/405

Primary Examiner—Gregory D. Thompson
Attorney, Agent, or Firm—Oblon, Spivak, McClelland, Maier & Neustadt

[57] ABSTRACT

An electronic circuit with flip-chip mounting of a semiconductor chip (5) on a substrate (1), wherein there is provided between the semiconductor chip (5) and the conductor tracks (2) of the substrate (1) a metallic solder stop layer (3) which is insulated from its environment by an oxide layer (4). With this type of solder stop layer, it is possible to obtain layer thickness which can be exactly reproduced, as a result of which a reliable flip-chip soldering is achieved.

8 Claims, 1 Drawing Sheet

ELECTRONIC CIRCUIT AND METHOD OF PRODUCTION THEREOF

BACKGROUND OF THE INVENTION

1. Field of the Invention

The present invention relates to the field of microelectronics. It relates in particular to an electronic circuit including a substrate having a plurality of conductor tracks applied to a top side of the substrate, a semiconductor chip arranged at a distance from the substrate on the top side thereof and electrically connected to the conductor tracks by means of solder connections at given points, and a solder stop layer provided on the conductor tracks between the conductor tracks and semiconductor chips and surrounding the solder connections, as well as a method of production thereof. Circuits of this kind are known from the prior art under the name of "flip-chip" mounting.

2. Discussion of Background

When soldering flip-chips (these are "naked" semiconductor chips with solder pellets (so-called bumps) as contacting elements) onto a substrate provided with conductor tracks, the use of a solder stop layer is advantageous and known.

This solder stop layer prevents the solder spreading out along the conductor tracks and consequently the semiconductor chip coming to rest on the substrate and causing undesired short-circuits.

Conventionally used for the solder stop layer is an organic solder resist which is usually applied in a screen printing technique or as a photolithographically processed fluid or film onto the substrate.

A solder resist of this kind has however the following disadvantages when used for flip-chip soldering:
  poor temperature stability; and too high layer thicknesses which cannot be reproduced exactly.
  Since when fixing the flip-chips the edges of the solder stop layer serve at the same time to align the chip on the substrate, a layer thickness which cannot be reproduced has the following consequences:
  if the layer thickness is too small, the alignment effect of the edges is lost;
  if the thickness is too great, on the other hand, the soldering becomes irregular and leads to a defective contact between chip and substrate.

SUMMARY OF THE INVENTION

Accordingly, one object of this invention is to provide a novel electronic circuit with which a uniform and reliable flip-chip mounting is ensured, as well as to state a method of production for such a circuit.

The above object is achieved according to the present invention by providing a new and improved circuit of the type mentioned in the above-noted field of the invention, wherein the solder stop layer includes an oxidizable metal and has its surface covered with an oxide layer.

The core of the invention lies in the fact that the non-reproducible organic solder stop layer is replaced by a simple metallic solder stop layer which is to be evenly deposited. The necessary insulation protection is achieved in this arrangement by an oxide layer on the surface of the solder stop layer.

In accordance with a preferred exemplary embodiment, nickel is used as the metal, and the nickel oxide layer is produced by oxidation of the nickel.

The present invention further includes a method of making an electronic circuit including the above-noted substrate, semiconductor chip, and solder top layer, including the steps of providing conductor tracks on the top side of the substrate, applying a structured metal layer to the conductor tracks thereby to form the solder stop layer on the conductor tracks, oxidizing the solder stop layer to produce an oxide layer on an exposed surface of the solder stop layer, providing a semiconductor chip with bumps of solder provided on an underside of the semiconductor chip and placing the semiconductor chip with these bumps onto the conductor tracks with the solder bumps aligned on the conductor tracks by means of the solder stop layer, and heating the bumps provided on the underside of the semiconductor chip to produce solder connections between the semiconductor chip and the conductor tracks.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
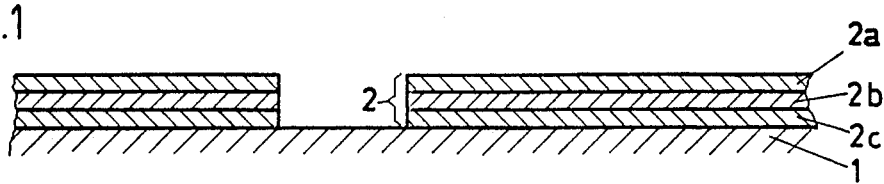
FIGS. 1–4 show various steps during the production
  of an electronic circuit according to an exemplary embodiment of the invention; and
  shows a finished electronic circuit according to an exemplary embodiment of the invention.

Referring now to the drawings, wherein like reference numerals designate identical or corresponding parts throughout the several views, FIG. 1 illustrates the production of an electronic circuit with flip-chip mounting, wherein the invention starts initially with a substrate 1, on the surface of which conductor tracks 2 are applied with the given structure.

In this arrangement, the conductor tracks 2 have, for example, a three-layer construction with an adhesive layer 2c lying at the bottom (of NiCr, Cr or similar metals), a middle diffusion barrier layer 2b (of Ni or similar metals) and a conductor layer 2a (of Cu, Au or similar metals).

Figure 2:
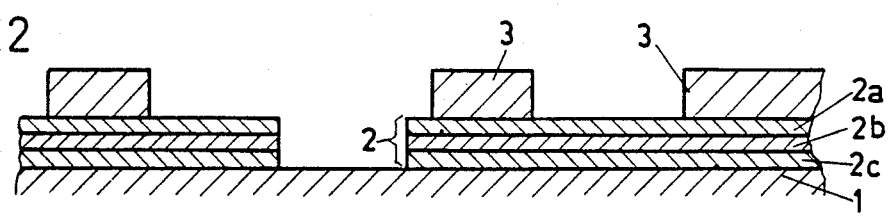

A structured metallic solder stop layer 3 (preferably of Ni) is now applied to the conductor tracks 2, preferably by electrodeposition (FIG. 2). This solder stop layer 3 contains holes at the point where the conductive connection to a semiconductor chip is to be produced later, which holes serve simultaneously for aligning the chips.

Figure 3:
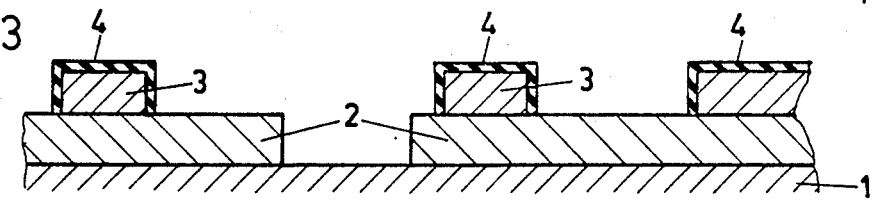

After the solder stop, layer 3 has been deposited, an oxide layer 4 preferably nickel oxide is produced on its surface by oxidation, which oxide layer electrically insulates the solder stop layer 3 from its environment and ensures that no undesired contact to the later superjacent semiconductor chip is produced (FIG. 3).

The oxidation can be carried out in various ways: One possibility is thermal oxidation by heating up the coated substrate in an oxygen-containing atmosphere. A further possibility is the action of an oxygen-containing plasma on the surface of the solder stop layer 3. A third possibility is wet-chemical oxidation in a suitable chemical bath. Each of these three possibilities has its own advantages and disadvantages here.

Figure 4:
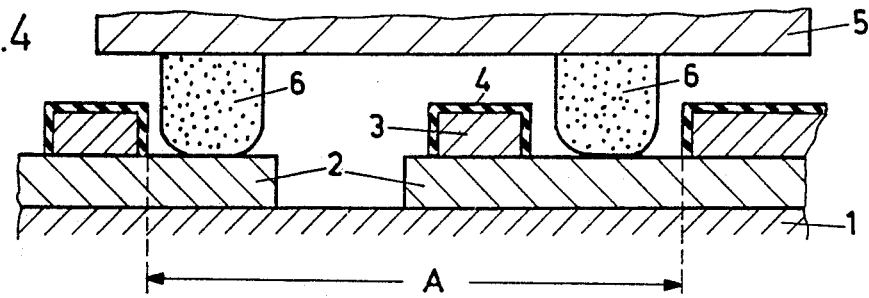

Once the solder stop layer 3 has been prepared thus far, a naked semiconductor chip 5, which is provided on its underside with solder pellets in the form of bumps 6, is placed on the substrate 1 (FIG. 4). The bumps 6 here engage in the prepared holes in the solder stop layer 3 and are aligned by means of a given alignment distance A of these holes.

Figure 5:
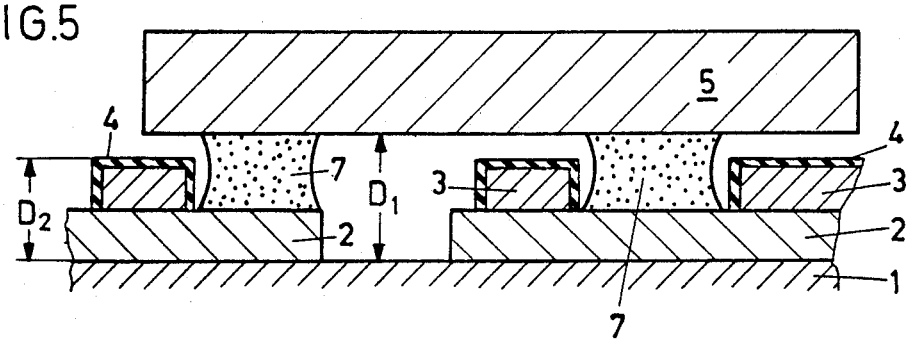

After alignment, the entire arrangement is heated up to the extent that the solder of the bumps 6 melts and forms a fixed solder connection 7 between the semiconductor chip 5 and the conductor tracks 2 (FIG. 5). The solder spreads out slightly here, but its spread is limited by the solder stop layer 3 and, owing to the surface tension of the semiconductor chip 5, stops at a distance D1 which is greater than the distance D2 of the top oxide layer 4 from the substrate 1.

Since it is very easy to set exactly reproducible thicknesses with the metallic solder stop layer, the invention produces a particularly reliable electronic circuit.

Obviously, numerous modifications and variations of the present invention are possible in the light of the above teachings. It is therefore to be understood that within the scope of the appended claims, the invention may be practiced otherwise than is specifically described herein.

What is claimed as new and desired to be secured by letters patent of the United States is:

1. An electronic circuit comprising:
    a substrate having a top side and an underside and a plurality of conductor tracks applied to the top side;
    a semiconductor chip arranged at a distance from the substrate on the top side thereof and electrically connected to the conductor tracks by means of solder connections at given points;
    a solder stop layer provided on the conductor tracks between the conductor tracks and the semiconductor chip, said solder stop layer surrounding the solder connections connecting the semiconductor chip to said substrate;
    said solder stop layer comprising an oxidizable metal; and
    said solder stop layer having an exposed surface covered with an oxide layer.

2. An electronic circuit as claimed in claim 1, wherein:
    the solder stop layer is composed of nickel; and
    the oxide layer contains nickel oxide.

3. A method of production of an electronic circuit including a substrate having a top side and an underside and a plurality of conductor tracks which are applied to said top side, a semiconductor chip arranged at a distance from said substrate on said top side of said substrate and electrically connected to said conductor tracks by means of solder connections at given points, a solder stop layer provided on said conductor tracks between said conductor tracks and said semiconductor chip, said solder stop layer surrounding said solder connections, said solder stop layer comprising an oxidizable metal having an exposed surface covered with an oxide layer, comprising:
    providing said conductor tracks on said top side of said substrate;
    applying to said conductor tracks a structured metal layer thereby to form on said conductor tracks said solder stop layer;
    oxidizing said structured metal layer to produce said oxide layer on an exposed surface of said solder stop layer;
    providing said semiconductor chip having solder bumps provided on an underside surface of said semiconductor chip and placing said semiconductor chip with said solder bumps onto said conductor tracks with said solder bumps aligned on said conductor tracks by means of said solder stop layer; and
    heating said solder bumps to produce said solder connections between said semiconductor chip and said conductor tracks.

4. The method as claimed in claim 3, wherein said step of applying said structured metal layer comprises:
    electrodepositing said structured metal layer.

5. The method as claimed in claim 4, comprising:
    using nickel as the metal for said solder stop layer.

6. The method as claimed in claim 5, wherein said step of oxidizing said structured metal layer comprising:
    performing thermal oxidation on said metal layer.

7. The method as claimed in claim 5, wherein said step of oxidizing said structured metal layer comprises:
    applying a plasma action on said structured metal layer.

8. The method as claimed in claim 5, wherein said step of oxidizing said structured metal layer comprises:
    performing a wet-chemical oxidation on said structured metal layer.

* * * * *